United States Patent [19]
Crane et al.

[11] Patent Number: 5,479,110
[45] Date of Patent: Dec. 26, 1995

[54] PRINTED FLEXIBLE CIRCUIT TERMINATIONS AND METHOD OF MANUFACTURE

[75] Inventors: Jesse Crane, South St. Paul; Robert E. Vosika, Arden Hills; Horst Franke, Centerville, all of Minn.

[73] Assignee: Advanpro Corporation, St. Paul, Minn.

[21] Appl. No.: 180,607

[22] Filed: Jan. 13, 1994

[51] Int. Cl.[6] .............................. G01R 31/02; G01R 1/06
[52] U.S. Cl. .............................. 324/757; 439/65; 439/67; 439/73; 439/331; 324/754
[58] Field of Search .............................. 439/65–67, 73, 439/525, 77, 493, 331; 324/754–762

[56] References Cited

U.S. PATENT DOCUMENTS

| | | | |
|---|---|---|---|
| 4,574,235 | 3/1986 | Kelly et al. .............................. | 324/754 |
| 4,827,211 | 5/1989 | Strid et al. .............................. | 324/754 |
| 5,277,594 | 1/1994 | Matsuoka et al. .............................. | 439/331 |

FOREIGN PATENT DOCUMENTS

| 0012480 | 1/1989 | Japan .............................. | 439/331 |
|---|---|---|---|

*Primary Examiner*—Kenneth A. Wieder
*Assistant Examiner*—Barry C. Bowser
*Attorney, Agent, or Firm*—D. L. Tschida

[57] ABSTRACT

Flexible contact terminals configured from printed strip circuits and usable with integrated circuit test fixtures. The termination circuits include printed conductive pathways formed on a flexible, multi-layered substrate. The conductive paths are three dimensionally tailored for impedance and resilience. Circuit processing includes steps to profile etch the conductive paths at the X, Y and Z-axis, especially end terminations. A support fixture contains the termination circuits to provide resilient electrical test terminations to circuit components supported to a resilient component support.

13 Claims, 13 Drawing Sheets

PRINTED FLEXIBLE CIRCUIT TERMINATIONS AND METHOD OF MANUFACTURE

BACKGROUND OF THE INVENTION

The present invention relates to integrated circuit (IC) test fixtures and, in particular, to flexible contact termination circuits usable therewith and configured from flexible printed circuits containing conductive pathways of tailored X, Y and Z-axis profiles. The circuit and pathways are constructed to provide predetermined impedance characteristics, include spaced, resilient contact terminations, and operate at gigahertz frequencies.

A fundamental requirement of electrical test fixturing is to repeatably and at high speeds make electrical contact to the lead terminations of circuit components admitted to the test fixturing. As each component is admitted, one or more contact assemblies make electrical contact to each or selected ones of the termination leads at the component. A resilient connection is preferred to accommodate packaging variations, yet achieve a good electrical contact with the component.

Numerous, commercially available test fixtures and contact assemblies provide discreet spring metal terminals which are separately staked and/or soldered to a contact assembly. Associated printed circuit pathways at a termination circuit of the assembly convey input/output signals from and to the components under test.

Although adequate for many types of components, discreet contact terminals necessitate relatively costly termination circuit assemblies, due to a necessity of separately staking and/or soldering each contact to the conductive pathways. The physical size of such terminals presents practical limits to the physical spacing attainable relative to the pin spacing and pin arrangement at a component under test and can affect the organization of the test fixture. The coupling interface between the terminals and signal paths also effect electrical performance and limit testing to frequencies well below the gigahertz range attainable with the present invention. Certain limits therefore exist to the types of components which can be tested and on occasion multiple fixturings and test passes may be required to test a single component. The corresponding fabrication complexity and necessity to separately inventory many uniquely configured contact assemblies for specific types of components to be tested further limits the flexibility of many test fixtures.

The use of discreet conductive paths and contacts also introduces signal impedance characteristics which can affect and limit the capability of many test fixtures to test certain circuits at operating frequencies. The latter difficulties are especially critical for test fixtures intended for use with components operating at frequencies in excess of 100 MHz and into the gigahertz range, which components are becoming increasingly more common.

As increasingly greater complexity has been integrated into most typical components, greater varieties of non-standard packaging configurations and types of lead terminations and lead arrangements have also appeared. The organization and presentation of such terminations about a component's periphery can vary widely. Terminal counts from 12 to 100 per side, per device can be encountered at various termination spacings. The termination organizations may be organized in standard arrangements to non-uniform or non-symmetric geometrical arrangements at multiple peripheral surfaces of a component package. The terminations may take the form of relatively rigid leads such as conventional SIP and DIP components, to gull wing terminations, to a variety of fine pitch QFP, PQFP/TQFP, SOP/TSOP, PLCC terminations, among others.

In appreciation of the increasing complexities of components being used to populate printed circuit assemblies, it is therefore preferred that any component test fixture be adaptable to accommodate a wide range of components. It is a further desire that each test point of any test fixture exhibit a known electrical characteristic from the point of contact to a component over the entire conductive pathway and to the test monitor. The latter attributes are met with the inventive termination circuits and fixturing of the present invention.

Test circuits which exhibit discreet, separately staked or soldered connections can be found at U.S. Pat. Nos. 4,686,463; 4,853,626; 4,965,865; and 5,121,053. The latter patents also disclose a variety of test fixtures which are compatible with different component packaging.

Other test assemblies of some relevance to the present invention are shown at U.S. Pat. Nos. 4,998,062; 5,091,694; 4,018,491; 4,472,876; 4,554,505; and 4,686,468. Various of these references depict fixtures which contain contact assemblies having conductive pathways which terminate at spaced apart, comb-like contacts which integrally extend from printed circuit pathways. The contact terminations and associated pathways are constructed to uniform thickness and are fabricated using conventional PC fabrication techniques.

The pathways may include additional plating to add thickness, for example, at selected through hole vias. Resilient support assemblies are included with various of the test fixtures to resiliently support each contact. The contacts otherwise are not particularly constructed to provide independent resilience.

U.S. Pat. No. 4,085,502 also discloses a method and flexible circuit structures which include "plated-up" mesas that are etched to form rigid, integral terminations. The terminals are intended for mounting to PC boards and are not constructed to provide any inherent resilience.

In appreciation of the foregoing deficiencies in the art, the present invention provides test fixtures and contact termination circuits usable therewith which provide electrically uniform, contiguous, conductive pathways that are "etched down" to preferred three-dimensionally sculptured shapes. The termination circuits are constructed using conventional printed circuit fabrication techniques, yet facilitate an ability to economically construct wide varieties of special purpose and custom test assemblies. The termination circuits can be prepared to pre-determined impedance and resilience characteristics, and permit operating frequencies into the gigahertz range. The circuits readily mount to existing and custom developed component test fixtures. As necessary, additional resilience can be provided at the test fixture with a resilient component support surface.

SUMMARY OF THE INVENTION

It is accordingly a primary object of the present invention to provide a modular, component test fixture assembly which is adaptable to test wide varieties of electrical components configured in varieties of packages or housings and lead terminations.

It is a further object of the invention to provide flexible, termination circuits, which are producible using conventional printed circuit fabrication techniques, and which exhibit sculptured regions of tailored X, Y and Z-axis profiles (i.e. etched down versus plated up).

It is a further object of the invention to provide contiguous conductive pathways wherein the profiling of contact terminations in combination with a cover clamping action and circuit layering provides a preferred contact resilience.

It is a further object of the invention to provide three dimensionally sculptured pathways which are tailored to exhibit a preferred electrical characteristic in relation to the operating frequency of test functions.

It is a further object of the invention to provide sculptured contact terminations formed on a multi-layered substrate, including appropriately arranged ground layers, insulator layers, dielectric layers and signal path layers.

It is a further object of the invention to provide sculptured circuit paths which exhibit an impedance characteristic in a range of 25 to 95 ohms, which are formed of an etched, metal alloy demonstrating a desired resilience properties, such as a beryllium/copper alloy and which accommodate gigahertz test frequencies.

Various of the foregoing objects, advantages and distinctions of the invention are particularly obtained in a component test fixture assembly including a body piece which cooperates with bottom and top cover plates to contain a folded, flexible termination circuit having three dimensionally profiled, printed conductor paths and termination contacts. The cover plate and a resilient, spring-biased component support include mating indices to orientate and restrain admitted components in relation to the termination circuit contacts.

The multi-fingered circuit contacts are retained to the component support body to project into a cavity adjacent the component support. Upon engaging the cover to the contacts, with the admission of each component, the contacts flexibly contact the component leads. Staked pins are secured to the termination circuit at soldered vias and project from the bottom cover plate.

The termination circuit is constructed in a flexible multi-layer assembly. Selected layers are fabricated and arranged to provide a reference or ground layer and a predetermined impedance characteristic at each conductive pathway, for example, in the range of 25 to 95 ohms.

In a preferred construction, a KAPTON cover layer overlies a signal layer containing multiple printed beryllium copper pathways, a kapton substrate layer, and a ground plane layer. Adhesive layers appropriately bond the layers to one another. The KAPTON cover terminates at a point adjacent the region of cover contact. The substrate 35 and ground plane layers may be removed over a portion of the contact surface to facilitate flexure.

Selected regions and ones of the conductive paths particularly exhibit regions of preferred vertical profile. The thickness and configuration of the pathways is determined by etching down a sheet of conductive material in relation to a contact resilience and impedance characteristic desired for each conductor and a particular test component.

Still other objects, advantages and distinctions of the invention will become more apparent upon reference to the following description with respect to the appended drawings. To the extent various modifications and improvements have been considered, they are described as appropriate. The description should not be interpreted in strict or literal limitation of the invention, which rather should be interpreted within the scope of the appended claims.

DESCRIPTION OF THE PREFERRED EMBODIMENT

Figure 1:
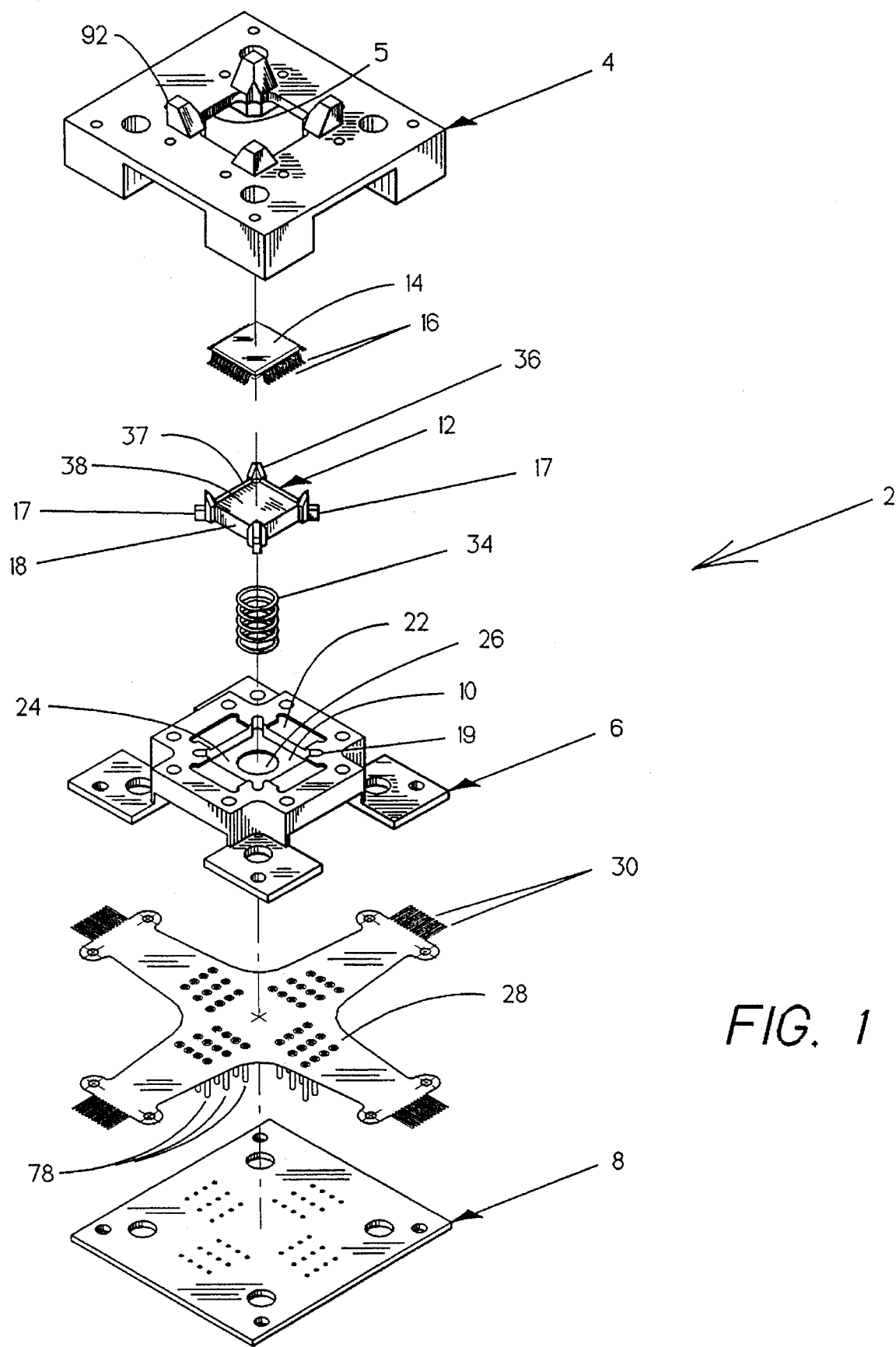
FIG. 1 is a perspective drawing shown in exploded assembly of an integrated circuit test fixture which includes a flexible termination circuit of the invention.
Figure 2:
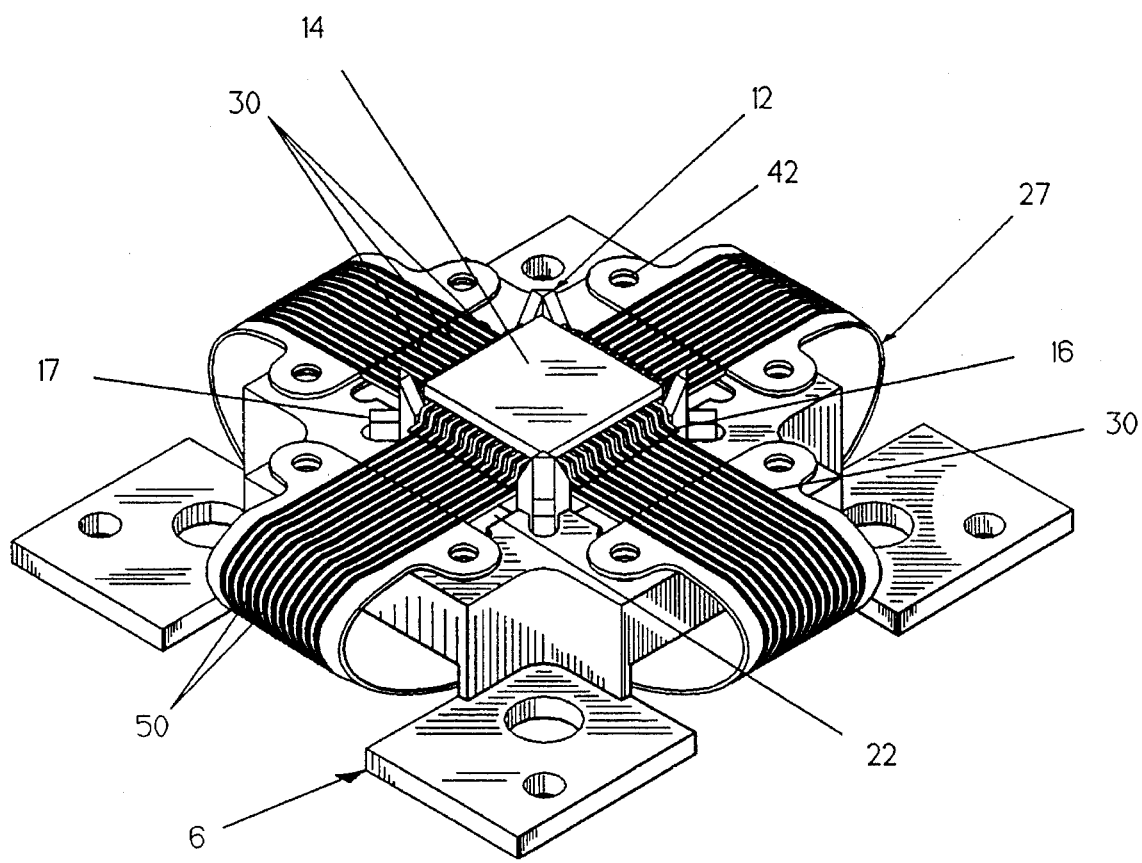
FIG. 2 is a perspective drawing showing a component mounted to the test fixture.
Figure 3:
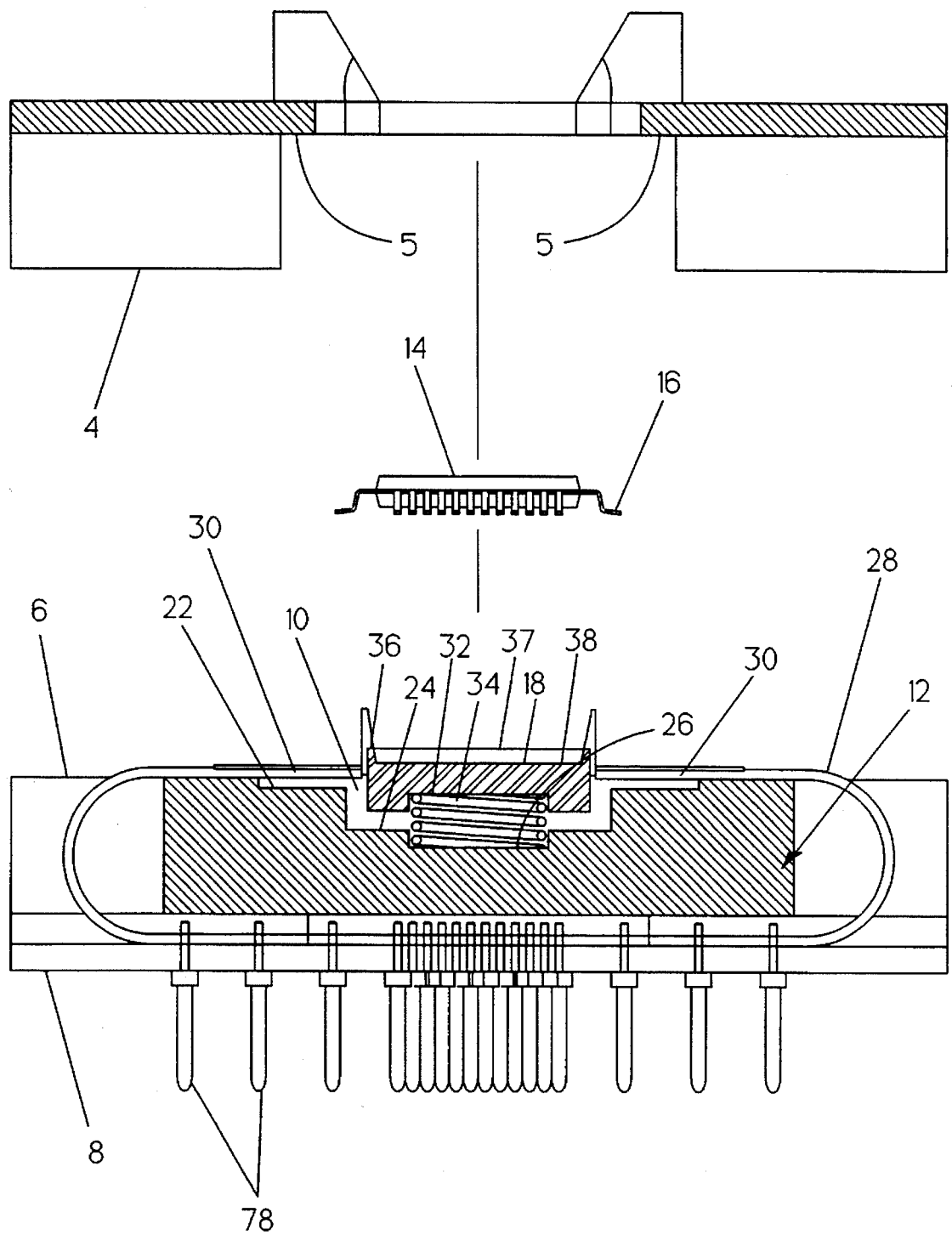
FIG. 3 is a drawing shown in exploded assembly and partial cross section through the body piece prior to supporting the component.
Figure 4:
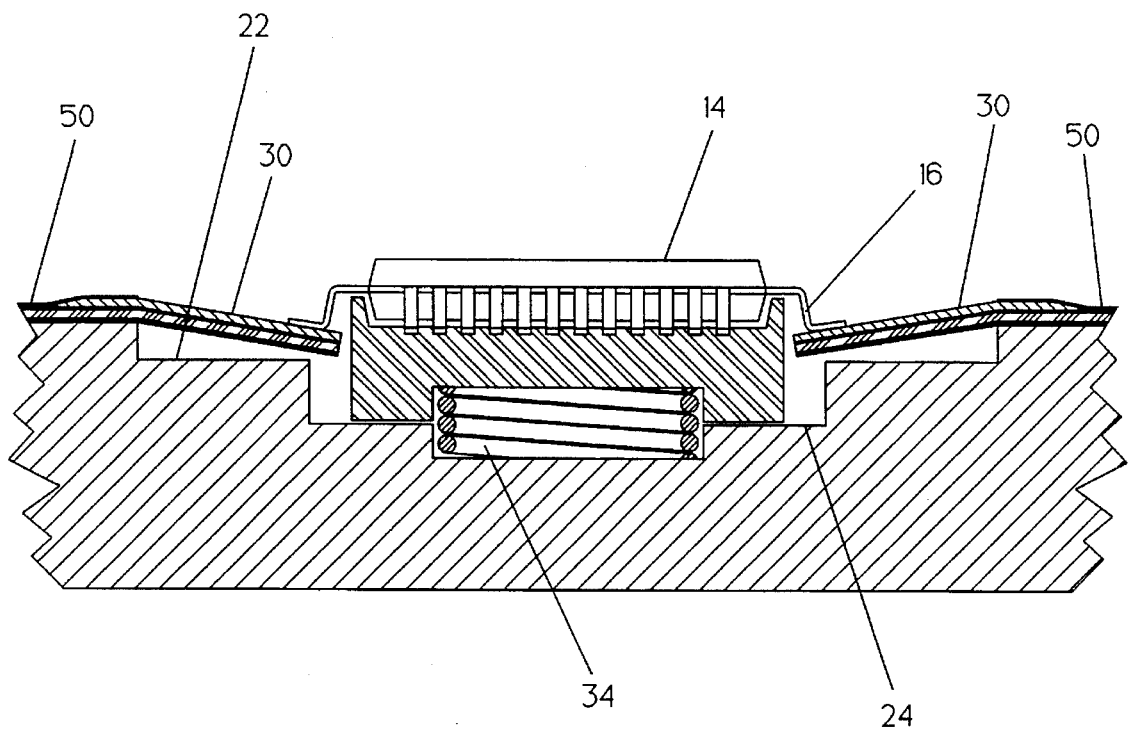
FIG. 4 is a drawing shown in cross section through the body piece upon supporting a component.

Referring to FIGS. 1 and 2 perspective views are shown in exploded assembly and partial section of the IC test fixture 2 of the invention. FIGS. 3 and 4 depict cross section views of a typical test component in relation to the test fixture 2, prior to and after securing the component to the fixture 2. With collective attention to FIGS. 1–4, the fixture 2 includes a top cover plate 4, a center body piece 6 and a bottom cover plate 8. A cavity 10 is formed into the body 6 to contain a resilient, component support assembly 12.

A typical flat packaged component 14 is depicted in relation to the body 6 and support assembly 12. A number of lead terminations 16 radiate from the component 14. Although one type of component 14 containing "gull wing" terminals 16 is depicted, it is to be appreciated a multitude of differently shaped components containing numerous types and arrangements of terminals 16 can be provided at the component 14.

The component support 12 includes a center piece 18 which mounts within the cavity 10. Corner projections 17 extend from the center piece 18 to mate with slots 19 formed into the body 6 to align one to the other.

The recessed cavity 10 is cut into the approximate center of the body 6 and provides a series of successively lower surfaces 22, 24 and 26. A flexible, contact termination circuit 28 is arranged and secured to and intermediate the base cover 8 and body 6 such that a plurality of fingered component contacts or terminations 30 project into the aperture 10, above the surface 22. Upon positioning the cover 4 to the body 6, the terminations 30 are clamped at a peripheral edge 5 of a bore in the cover 4 to limit termination flexion to the portion which projects above the surface 22. The surface is recessed approximately 0.1 inches below the termination 30.

The center piece 18 is mounted within the aperture 10 above the surface 24. A cavity space 32 let into a bottom of the outer piece 18 receives a spring 34 which projects from the surface 26. A number of alignment indices or corner posts 36 and peripheral flanged edges 37 project from a central, surface area 38 to align the component 14 to the fixture 2 and to the center piece 18.

Upon admitting a component 14 to the center piece 18, the component aligns to the cornerposts 36 and is loosely restrained in the space between the flanges 37. In lieu of cornerposts 36, a cavity alone or other component alignment indices can be provided to assure a proper positioning and retention of each component 14.

The center piece 18 aligns each component 14 to the fixture 2 such that the terminations 16 radiate into the cavity space 10 in alignment with the fingered terminations 30 of the circuit 28. The manner of the foregoing alignment is depicted at FIGS. 2 through 4 and from which the mounting of the flexible termination circuit 28 to the body 6 is also apparent.

The center piece 18 is constructed of an electrically insulative material of relatively firm durometer. The durometer can be varied in combination with the tensile properties of the spring 34 to provide a desired degree of support resilience. The resilience of the support is particularly tailored to prevent component "bounce" and misalignment, as components are admitted to and removed from the fixture 2 at normal test speeds. In combination with the termination circuit 28, the support 12 assures a firm electrical contact with each terminal 16.

Although the assembly 2 preferably includes a spring 34, it is to be appreciated the center piece 18 can be used alone. In such an instance, the durometer of the center piece 18 can be varied as well as the vertical separation of the surface 38 to the surface 22 to permit a compression of the center piece 18 as the cover 4 depresses the component 14 and clamps the terminations 30 at the edges 5.

Figure 5:
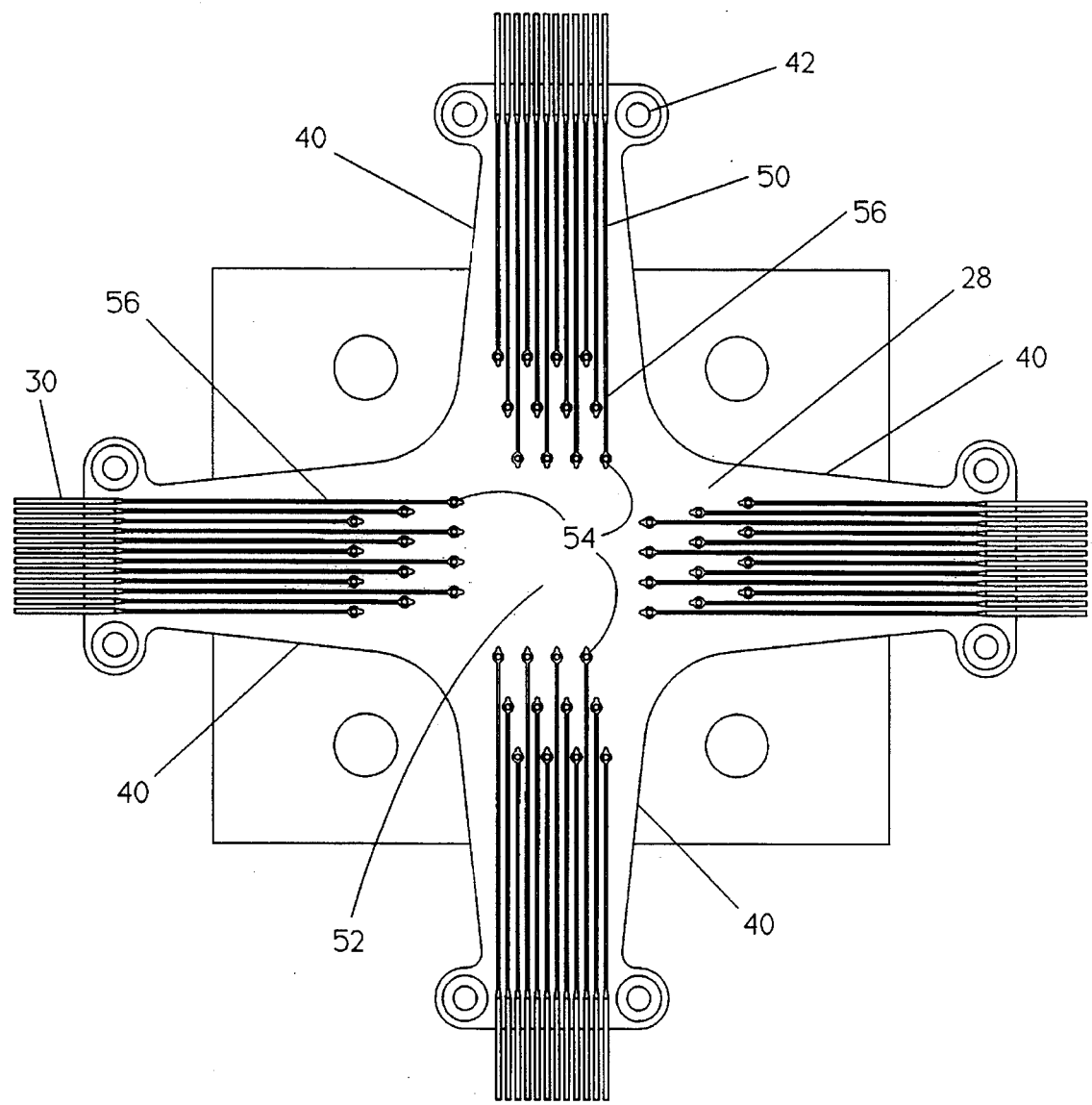
FIG. 5 is a plan view of the flexible termination circuit mounted to a bottom cover of the test fixture prior to folding.

With attention also to FIG. 5, it is to be appreciated that four flexible wings or extensions 40 of the circuit 28 fold from beneath the body 6 and over the cavity 10. The circuit 28 is secured to the body 6 with a number of fasteners (not shown) at holes 42 formed into each extension piece 40. The center-to-center spacing of each contact termination 30 is adjusted depending upon the lead spacing or pin pitch at the component 14. Spacings as small as of 0.015 to 0.10 inches are readily obtained with the circuit 28.

A floating or resilient contact is particularly obtained between each of the fingered termination contacts 30 and the leads 16. FIG. 4 depicts the terminations 30 as they appear when flexed versus the unflexed condition, which is shown at FIG. 3. Each termination 30 integrally extends from one of the conductive pathways 50.

The degree of contact resilience is determined during the processing of the individual conductive pathways 50, independent of the resilience of the support assembly 12. That is, the pathways 50 are three dimensionally sculptured or etched down during processing to exhibit a desired degree of flexion at the terminations 30, comparable to the flexion of discreet contacts but in an integral pathway. The manner of obtaining the flexibility of the terminations 30 is described in greater detail below with respect to FIGS. 6 through 9.

The inherent resilience of each contact 30 in combination with the vertical offset provided at the center piece 18 to the surfaces 22 and 24 assures that a wiping action is obtained as each terminal 16 is contacted by the terminations 30. Potential problems of surface oxidation are thereby minimized and a resilient electrical contact is made. Repeatable contacts are also assured for life cycles in excess of $10^6$ operations per termination 30.

Turning attention to FIGS. 6 through 9, more of the details of the construction of the circuit 28 are apparent. As noted, a number of discrete conductive signal paths 50 are provided about the circuit 28. The paths extend from a center region 52 to and along each of the winged extensions 40.

The circuit 28 is constructed as a flexible, multilayer assembly using conventional printed circuit fabrication techniques. That is, the various layers are formed from sheets of known materials which are layered or sandwiched upon each other. The signal or conductive layer 56 is processed using conventional photolithographic processing techniques. However, in lieu of plating up the terminations 30, such as suggested at U.S. Pat. No. 4,085,502, the terminations 30 are etched down to a preferred three dimensional profile which exhibits a desired resilience. Circuits 28 having improved resilience and electrical characteristics and capable of operating at gigahertz test frequencies are thereby attained.

The finished thickness of the terminations 30 particularly approximates the initial thickness of the conductor material before processing. During the processing of the conductor paths 50, the terminations 30 are shaped and etched to taper down to an appreciably thinner main body or field segment 74 of each pathway 50. Greater uniformity in electrical and mechanical performance is thereby obtained from path to path 50 versus plating up the terminations before shaping the paths.

The various layers comprise a mechanical substrate 60 which is formed from a dielectric material, such as KAPTON, having a thickness selected in a range of 0.003 to 0.025 inches, depending upon a desired pathway impedance. The noted dielectric thicknesses accommodate impedances of 25 to 95 ohms at each pathway 50. Table I below sets out typical thicknesses of the dielectric layers 60 for obtaining the specifically indicated impedance values.

A copper ground plane 62, typically one ounce, rolled annealed copper and nominally 0.0014 inches thick, is bonded to the substrate 60 at an adhesive interface 64. A sculptured signal layer 66 of beryllium-copper alloy (i.e. XHMS C17200) containing the etched pathways 50 is bonded to the substrate 60 at an adhesive layer 68. A second dielectric layer 70, nominally 0.001 inch thick KAPTON, is bonded to the signal layer 66, except in the region of the terminations 30. All exposed metal surfaces, particularly the terminations 30, are plated with 0.0001 to 0.0002 inches of nickel and 0.00005 inches of gold.

Figure 6:
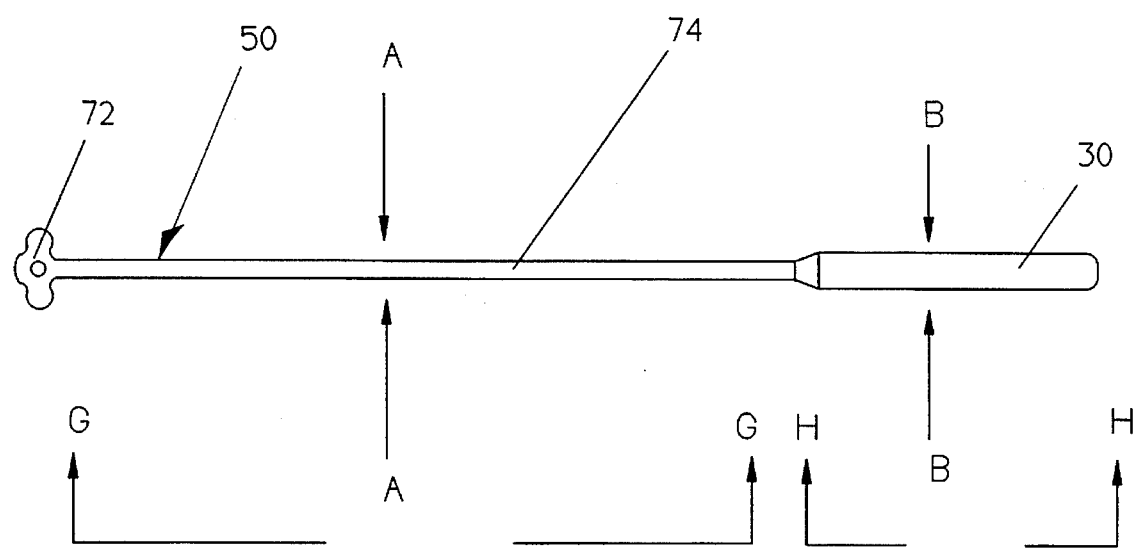
FIG. 6 is a plan view of one of the conductive pathways.
Figure 7:
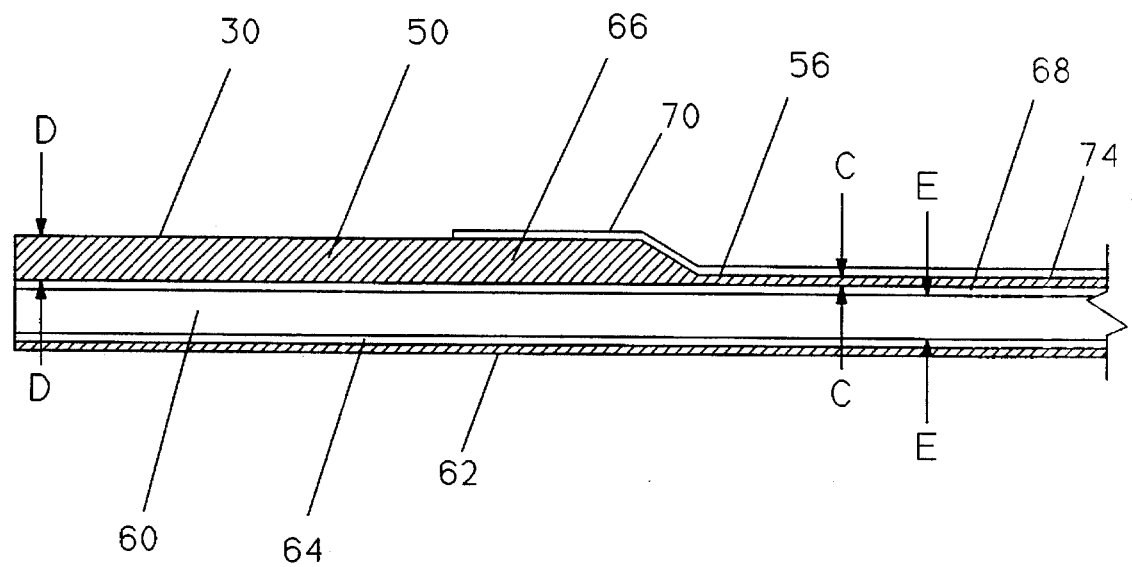
FIG. 7 is a longitudinal cross section view taken at one of the sculptured termination contacts of the circuit.
Figure 8:
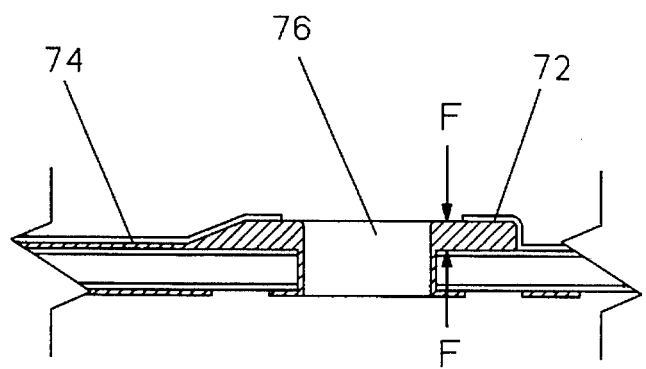
FIG. 8 is a longitudinal cross section view taken at one of the vias.
Figure 9:
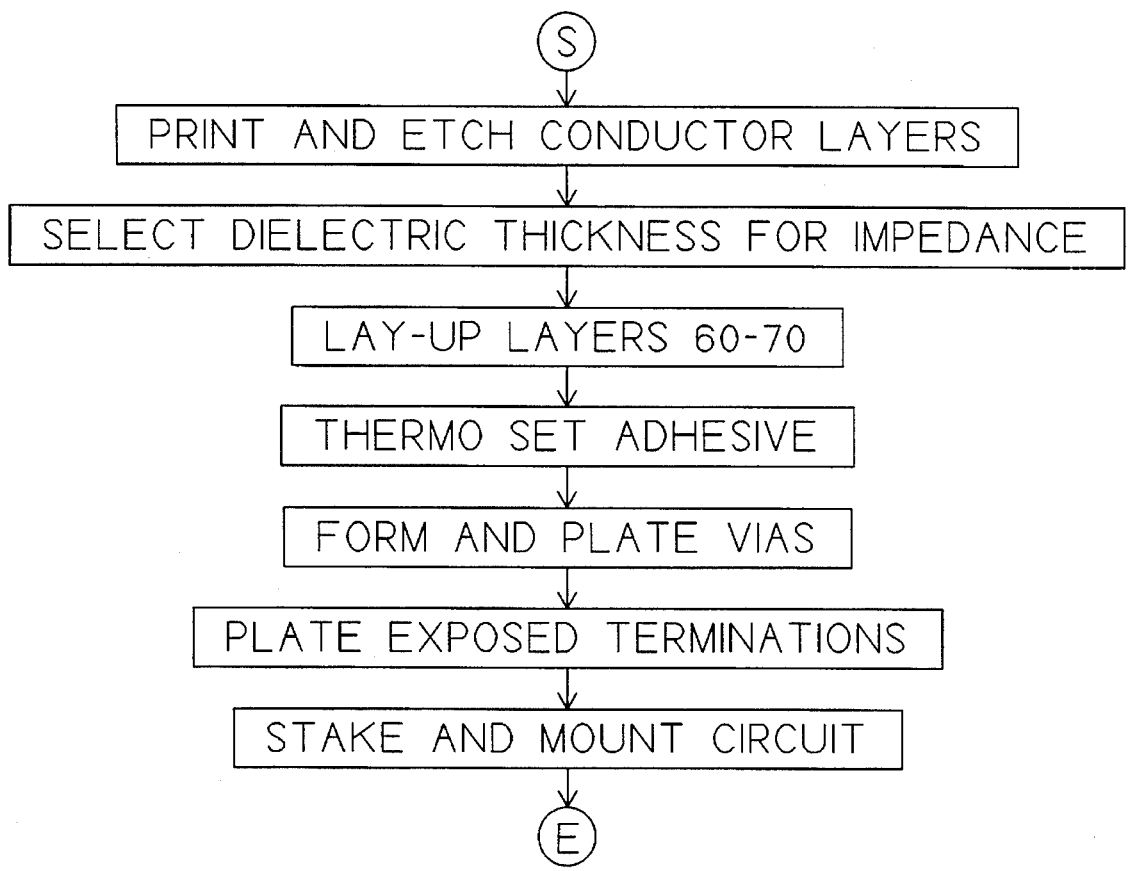
FIG. 9 is a flow chart of a method used to fabricate the termination circuit.

In contrast to known test contact termination circuits, the circuit 28 provides pathways 50 which are preferentially etched with selective photoresist and etch steps at each of the X, Y and Z axis of the layer 66. As a consequence, the profile of each signal path 50 is sculptured over its length to provide a relatively thick resilient contact termination 30 and a relatively thick contact pin via 72, which taper down to the relatively thin intervening field segment 74, reference FIG. 6. FIGS. 7 and 8 depict cross section views through the regions 30, 72 and 74. See also Table II for typical dimensions of the denoted regions of each pathway 50 for a 50 ohm path.

As particularly apparent from FIG. 7 and Table II, the profile of the contact termination 30 exhibits an greater thickness DD in relation to the thickness CC at the field 74. The thickness DD is sized in relation to CC to provide a preferred degree of resilience at each contact 30. The thickness FF at the vias 72 is sized to minimize potential damage, during the solder plating of the through holes 76 with a nominal 63/37 solder and the staking of contact pins 78 thereto. Various of the other critical dimensions of each pathway 50 are also shown at FIGS. 6 through 8 and Table II.

TABLE I

| Impedance (ohms) | Dielectric thickness (inches) |
|---|---|
| 25 | .0042 |
| 50 | .0083 |
| 75 | .0146 |
| 100 | .0251 |

TABLE II

Frequency versus Pathway Dimensions (inches)*

| Frequency | AA | BB | CC | DD | EE | FF | GG | HH |
|---|---|---|---|---|---|---|---|---|
| 100 MHZ | .010 | .012 | .008 | .010 | .0083 | .010 | 3 avg | .2 |
| 500 MHZ | .008 | .013 | .005 | .008 | .0083 | .008 | 2 avg | .2 |
| 1000 MHZ | .006 | .011 | .003 | .008 | .0083 | .008 | 1.5 max | .15 |
| 3000 MHZ | .004 | .009 | .0015 | .006 | .0083 | .006 | 1 max | .1 max |

*50 ohm conductor pathway

Figure 10:
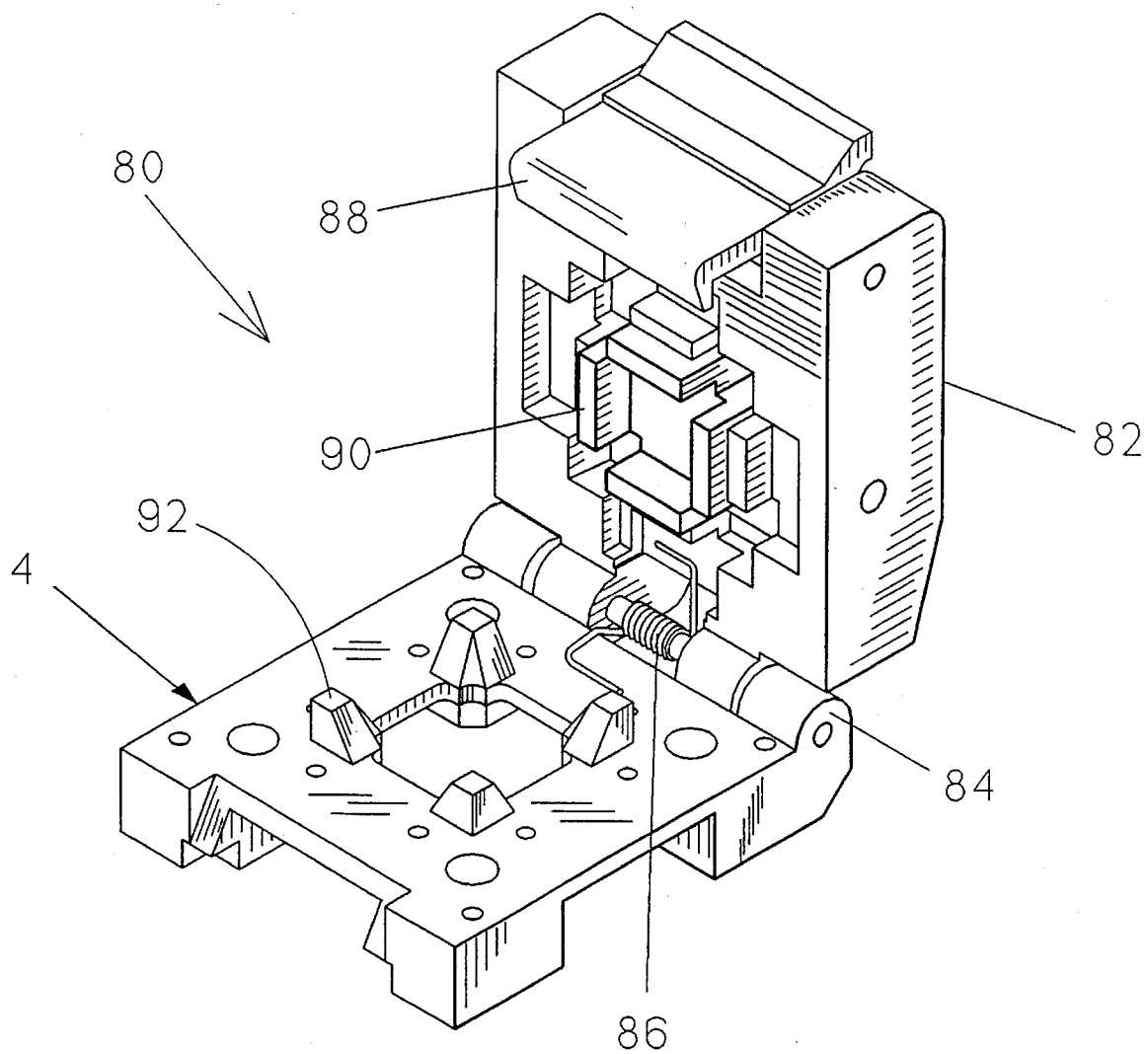
FIG. 10 is a perspective drawing of a latching cover which can be incorporated into the test fixture.

FIG. 10 depicts a portion of an alternate test cover assembly 80 which can be used with the cover 4, body 6, circuit 28 etc. of the assembly 2. The assembly 80 includes a latch cover 82 which mounts to the cover 4 at associated hinges 84. A spring 86 biases the latch cover 82 to a normally open condition upon releasing a finger actuated latch plate 88. Embossed projections 90 mate with projections 92 at the cover 4 and a supported component 14 to restrain the component 14 to the assembly 2 during test. Depending upon the test fixture, the latch cover 82 may or may not be required.

Figure 11:
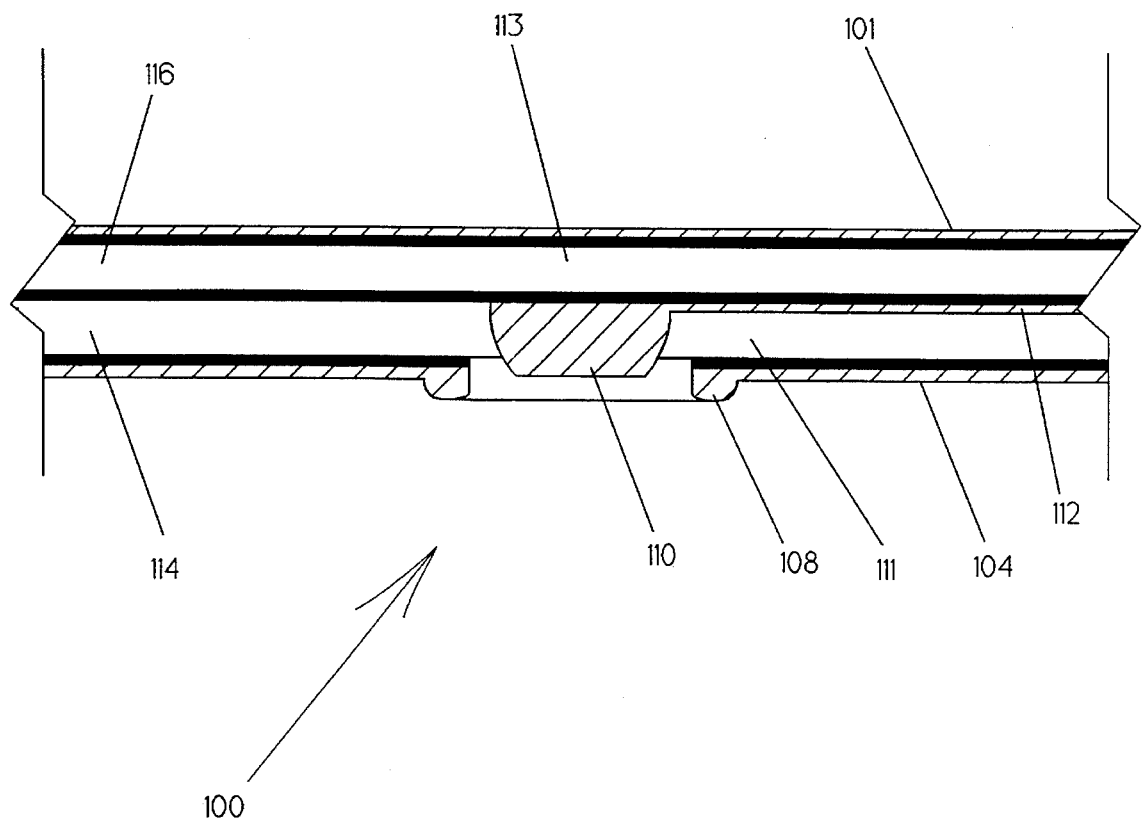
FIG. 11 is a longitudinal cross section view through an alternative sculptured via.
Figure 12:
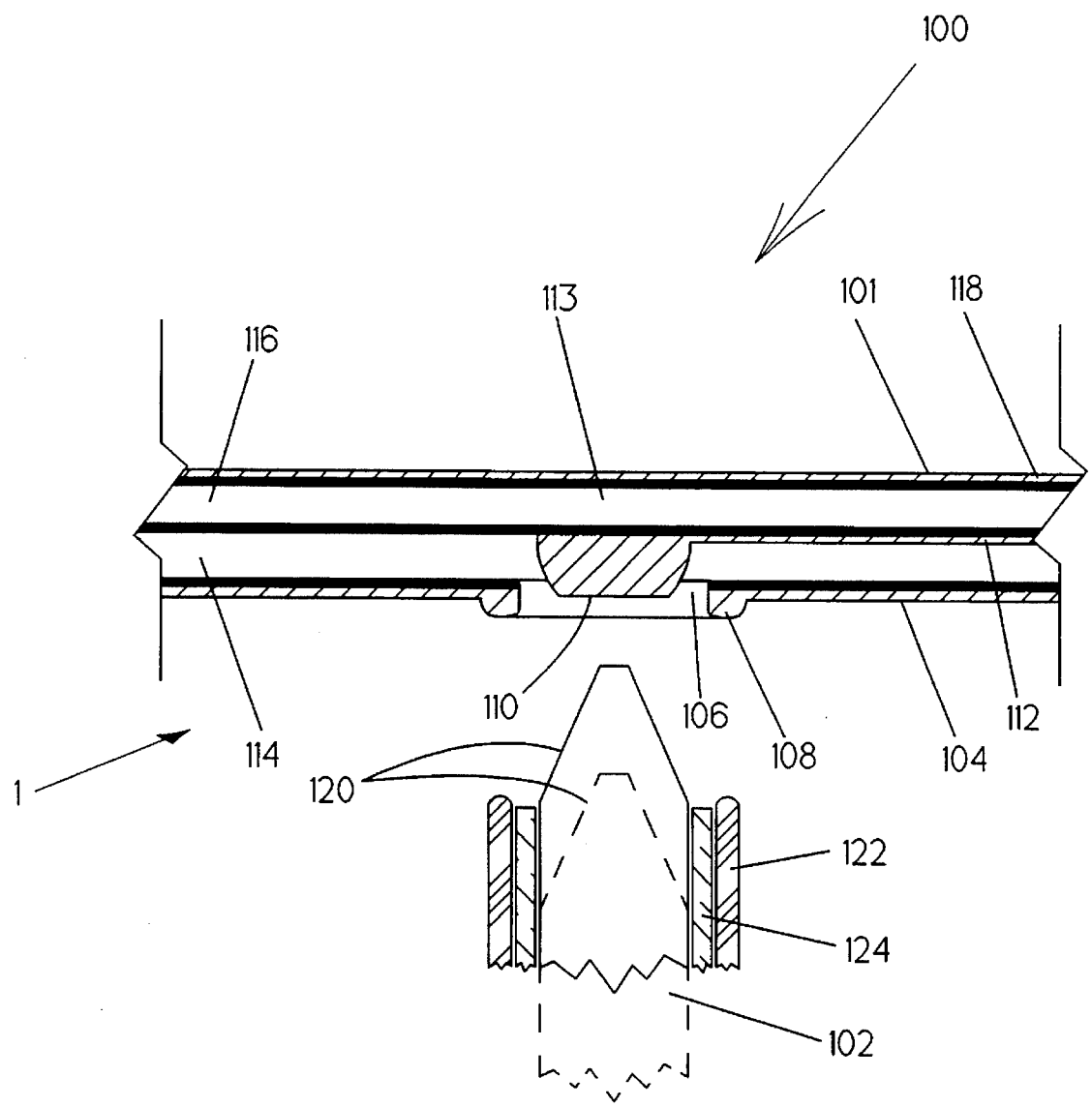
FIG. 12 is a drawing shown in exploded assembly of the manner of staking a "pogo" or coaxial contact pin to the sculptured via of FIG. 11.

FIGS. 11 and 12 depict an alternative construction of a representative contact pin via 100, such as might be incorporated into a circuit 101. The via 100 is adapted for use with a coaxial "pogo pin" 102, reference FIG. 12, which can be used to contact a contiguous conductive pathway of the circuit 101 in lieu of a contact pin 78. Only a portion of the circuit 101 is depicted, although it is to be appreciated numerous conductive paths, similar to the paths 50 normally would be included at a conductor layer 112. Each path would terminate at a via 100.

The circuit 101 includes a pair of ground planes 104 and 118 which bound intermediate dielectric layers 114 and 116 and the center conductor layer 112. The layers 104, 112, 114, 116 and 118 are bonded to one another with a resin adhesive, depicted in bold line.

Each via 100 of the ground plane 104 provides an aperture 106, which is surrounded by a raised or embossed annulus 108. A raised contact 110 projects from each conductive path of the conductor layer 112 into each aperture 106. The contact 110 is three dimensionally shaped by appropriately etching the layer 112.

Upon engaging the pogo pin 102 to the via 100, a center contact 120, which is shown in a recessed condition in dashed line, extends to contact the contact 110. A ground shield 122 simultaneously contacts the annulus 108. An insulator 124 separates the shield 122 and contact 120. A very precise shielded contact of a preferred and known impedance is thereby obtained between the circuit 101 and each contact pin 102. The impedance introduced with the coupling to each circuit path is particularly reduced and an improved high frequency response is obtained at the test fixture over the termination circuit 28.

Figure 13:
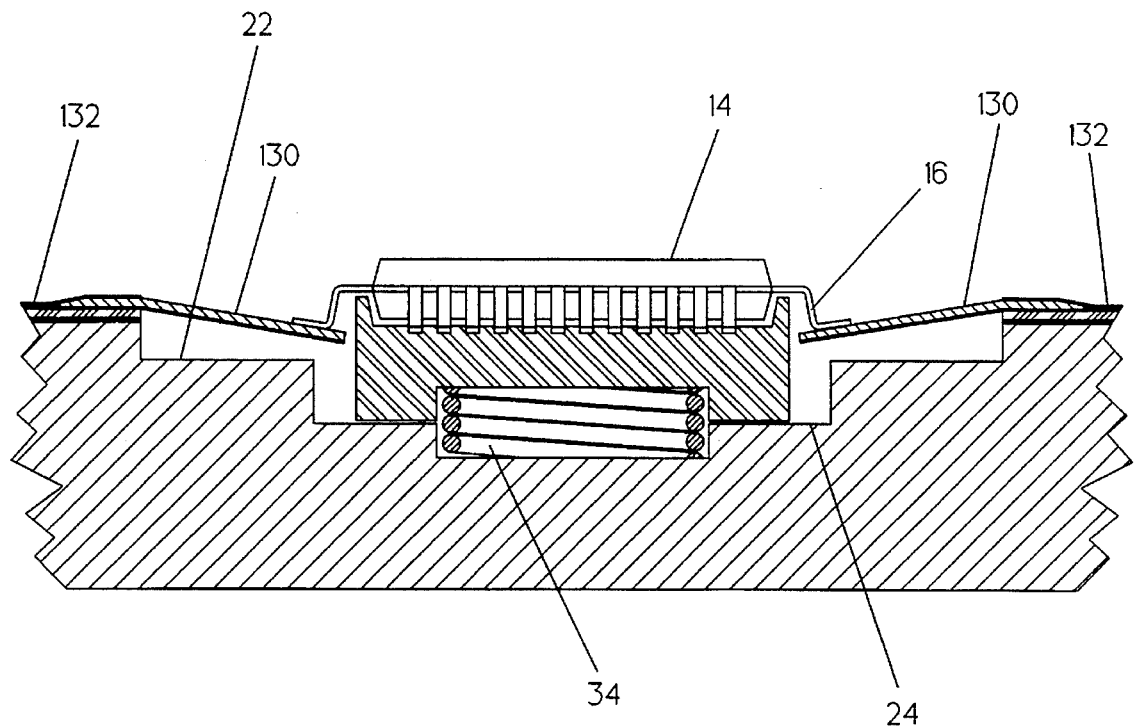
FIG. 13 is a cross section drawing of an alternative construction of a termination contact.

FIG. 13 depicts an alternative configuration of a contact 130 such as might be formed into a conductive pathway 132. The principal distinction between the pathway 132 and the paths 50 is that the support substrate 60 and ground layer 62 are removed from each termination 130 in the region above the surface 22. This is possible due to the inherent resilience of each termination 30 and 130 and which accommodate a nominal flexion in the range of 0.015 to 0.045 inches over the nominal unclamped length HH for each termination.

Figure 14:
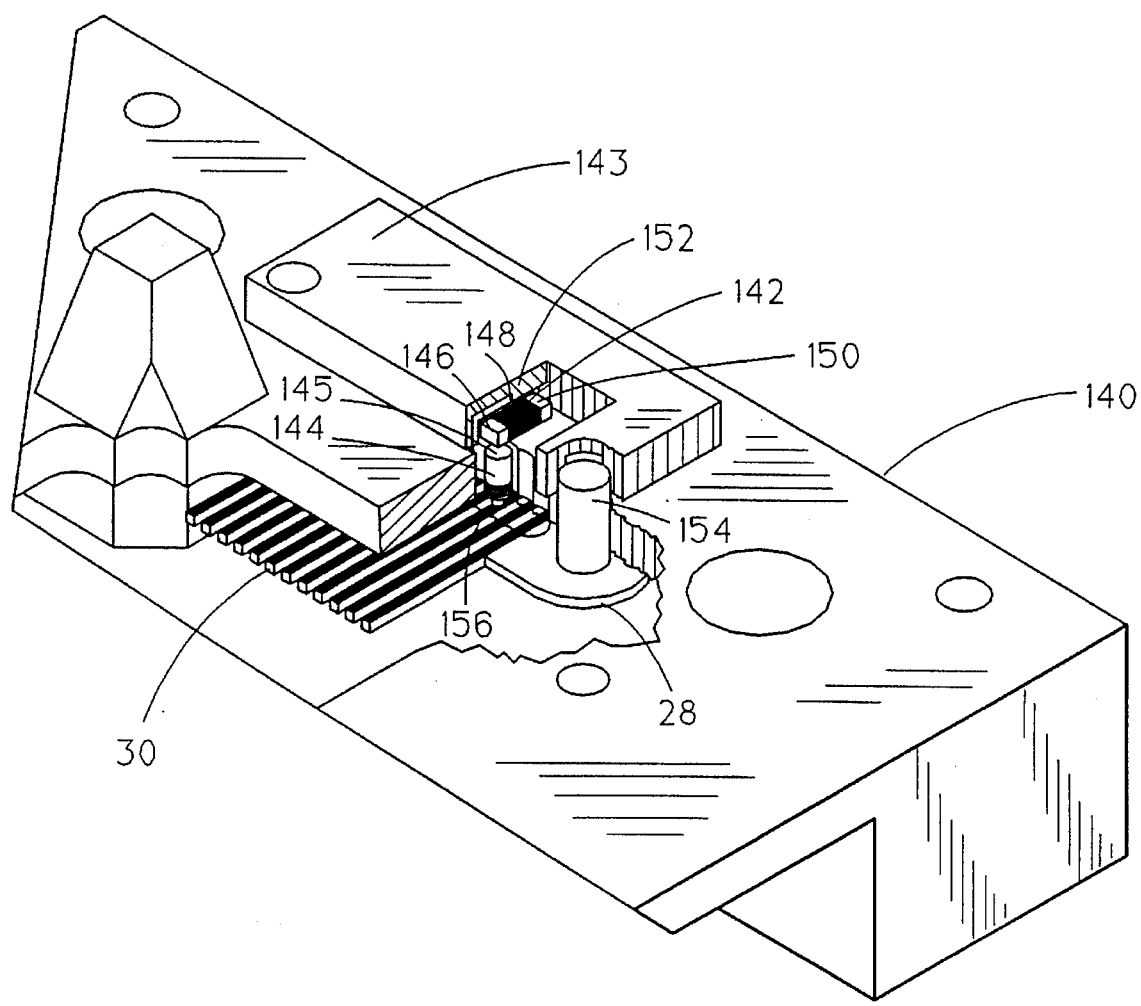
FIG. 14 is a perspective drawing shown in partial cutaway of an improved decoupling capacitor connection to the termination contacts of the invention.

Yet another advantage of the novel termination circuits and test fixtures of the invention is depicted at FIG. 14. FIG. 14 depicts a partial section through a cover 140 which is fitted to include a number of decoupling capacitors 142. The capacitors 142 are contained to the housing 143 to mount to the closest physical point possible to the point of contact between each termination 30 and lead 16. In lieu of separately mounting the decoupling capacitors 142 to the circuit 28, such as in the region 52, the capacitors 142 are retained to the cover 140 within a housing 143. Appropriate electrical connections are made to each termination 30 with the closure of the cover 140 and the contacting of individual gold plated, spring biased contacts 144 to the terminations 30. The housing 143 is constructed of an electrically conductive material and the reasons for which are more apparent below.

The contacts 144 are physically retained to the housing 143. An end 145 of each contact 144 electrically engages a terminal 146 of each capacitor 142 in a region beneath an electrical insulator 148. The insulator 148 electrically isolates the pins 144 from each other and assures electrical contact to only a selected one of the terminations 30. An opposite capacitor terminal 150 engages a region 152 of the housing 143 which is electrically coupled to the terminal 150 of each other capacitor 142, due to the conductive nature of the housing 143.

Upon engaging the cover 140 to a component 14, a tip 156 of each spring contact 144 resiliently engages one of the terminations 30 to complete a portion of a circuit path through each capacitor 142 to the ground plane 62. Each circuit path is completed via the housing 143 itself as an electrically conductive staked fastener 154, which retains the housing 143 to the cover 4, engages a fastener (not shown) which retains the circuit 28 to the body 6 and which fastener is electrically coupled to the ground plane 62 at the through hole 42. Simultaneously, each other termination 30 is capacitively decoupled and undesired electrical signals, which arise from the discontinuous connection to each lead 16, are conducted to ground to facilitate high frequency operation of the test fixture.

While the invention has been described with respect to a presently preferred construction and considered modifications and improvements thereto, still other constructions may suggest themselves to those skilled in the art. The following claims should be broadly construed to include such equivalent structures.

What is claimed is:

1. Electrical component test apparatus comprising:

a) a body including means for resiliently supporting a test component to said body such that a plurality of component terminals project into a first cavity disposed in said body adjacent said support means and further including cover means mounted to said body to contact each component inserted;

b) contact means having a conductive signal layer, a ground layer and a dielectric layer; wherein said dielectric layer separates said signal layer and said ground layer; wherein said signal layer includes a plurality of laterally displaced, seamless conductive paths etched from a homogeneous conductive material of a uniform thickness; wherein each of said plurality of conductive paths includes first and second etched contact terminations and an interconnecting field path; wherein said first terminations project unsupported in laterally displace relation to one another from a peripheral edge of said dielectric layer into said first cavity; and wherein the vertical thickness of said first and second terminations is greater than said field path, whereby said first terminations flex upon contact with respective ones of said terminals.

2. Apparatus as set forth in claim 1 wherein said contact means includes a flexible dielectric layer and a flexible ground layer and wherein each of said plurality of conductive paths exhibits an impedance characteristic in the range of 50 to 100 ohms to signals conducted over said paths at frequencies in the range of DC to 10 gigahertz.

3. Apparatus as set forth in claim 1 including a component retainer mounted in said cavity and supported above a spring such that upon contacting the cover to a component said spring is depressed.

4. Apparatus as set forth in claim 1 including an elastomer component retainer mounted in said cavity, which retainer compresses upon contacting the cover to a component, and having a plurality of projections which align the corners of said component to said retainer and said retainer to said body.

5. Apparatus as set forth in claim 1 wherein said dielectric layer comprises a center portion and from which radiates a plurality of wings, wherein said first terminations project unsupported from a peripheral edge of said wings, wherein said second terminations are formed at the center portion, and wherein said wings are folded to envelope said body such that said second terminations depend from beneath said body.

6. Apparatus as set forth in claim 5 wherein said first terminations are devoid of said dielectric substrate and ground layer in the region of said first cavity and wherein said wings are clamped between said cover and said body in the region of a dielectric layer which overlies said conductive paths.

7. Apparatus as set forth in claim 1 wherein said second terminations respectively support a plurality of terminal pins at a hole bored through each of said second terminations.

8. Apparatus as set forth in claim 1 wherein said conductive layer is mounted between first and second dielectric layers, wherein first and second ground layers cover said first and second dielectric layers, wherein adjacent ones of said first and second dielectric layers and said first and second ground layers includes a plurality of apertures aligned to expose said second terminations.

9. Apparatus as set forth in claim 11 wherein said plurality of capacitors and said plurality of contacts are mounted to an electrically conductive cover and including means for insulating portions of each of said capacitors and contacts from said cover.

10. Apparatus as set forth in claim 1 wherein said conductive paths are formed from a beryllium copper alloy.

11. Electrical circuit test apparatus comprising:

a) a body including means for resiliently supporting a test component to said body such that a plurality of component terminals project into a first cavity disposed in said body adjacent said support means and further including cover means mounted to said body to contact each component inserted;

b) contact means having a conductive signal layer, first and second ground layers and first and second dielectric layers; wherein said signal layer is mounted between said first and second dielectric layers; wherein said first and second ground layers cover said first and second dielectric layers; wherein said signal layer includes a plurality of seamless conductive paths; wherein a plurality of apertures communicate through said first and second dielectric layers with said plurality of conductive paths; wherein each of said plurality of conductive paths includes first and second etched terminations and an interconnecting field path; wherein the vertical thickness of said first and second terminations is greater than said field path; and wherein said said first terminations project unsupported from a peripheral edge of said first and second dielectric layers into said first cavity; and c) a plurality of capacitors mounted to said cover means and coupled to spring means for resiliently biasing a plurality of contacts to engage each of said first terminations and for completing a plurality of circuit paths through each of said plurality of capacitors upon contacting said cover means to a component.

12. Electrical circuit test apparatus comprising:

a) a body including means for resiliently supporting a test component to said body such that a plurality of component terminals project into a first cavity disposed in said body adjacent said support means and further including cover means mounted to said body to contact each component;

b) contact means having a conductive signal layer, a ground layer and a flexible dielectric layer; wherein said dielectric layer separates said signal layer and said ground layer; wherein said dielectric layer includes a center portion and from which radiates a plurality of wings; wherein said signal layer includes a plurality of seamless conductive paths; wherein each of said plurality of conductive paths includes first and second etched terminations and an interconnecting field path; wherein the vertical thickness of said first and second terminations is greater than said field path; and wherein said wings are folded to envelop said body such that said first terminations project unsupported from a peripheral edge of said plurality of wings into said first cavity and said second terminations depend from beneath said body; and c) means mounted to said cover means for capacitively decoupling each of said first terminations to said ground layer at substantially the point of contact between each of said first terminations and each of said terminals.

13. Electrical circuit test apparatus comprising:

a) a body including means for resiliently supporting a test component to said body such that a plurality of component terminals project into a first cavity disposed in said body adjacent said support means and further including cover means mounted to said body to contact each component;

b) a component retainer having a support surface which receives a component, wherein said support surface includes first protrusions which index the component to the support surface and second protrusions which index the retainer to the second surface and spring means for resiliently biasing said component support above said second surface;

c) contact means having a conductive signal layer, a ground layer and a dielectric layer; wherein said layer separates said signal layer and said ground layer; wherein said signal layer includes a plurality of seamless conductive paths; wherein each of said plurality of conductive paths includes first and second etched terminations and an interconnecting field path; wherein said first terminations project unsupported from a peripheral edge of said dielectric layer into said first cavity; and wherein the vertical thickness of said first and second terminations is greater than said field path; and c) a plurality of capacitors mounted to said cover means and coupled to spring means for resiliently biasing a plurality of contacts to engage each of said first terminations, whereby a plurality of circuit paths are resiliently completed through each of said plurality of first terminations and capacitors upon contacting said cover means to a component and said first terminations to said terminals.

* * * * *